United States Patent [19]

McColgin et al.

[11] Patent Number: 4,553,153
[45] Date of Patent: Nov. 12, 1985

[54] PLANARIZING LAYER FOR SEMICONDUCTOR SUBSTRATES SUCH AS SOLID STATE IMAGERS

[75] Inventors: William C. McColgin, Pittsford; Laurel J. Pace, Rochester, both of N.Y.

[73] Assignee: Eastman Kodak Company, Rochester, N.Y.

[21] Appl. No.: 544,154

[22] Filed: Oct. 21, 1983

[51] Int. Cl.$^4$ .............................................. H01S 3/00
[52] U.S. Cl. ..................................................... 357/30
[58] Field of Search ..................................... 357/30, 72

[56] References Cited

U.S. PATENT DOCUMENTS

| 4,051,374 | 9/1977 | Drexhage et al. |
| 4,136,225 | 1/1979 | Feit et al. |
| 4,190,446 | 2/1980 | Martin et al. |
| 4,196,009 | 4/1980 | Martin et al. |
| 4,266,017 | 5/1981 | Martin et al. |
| 4,285,007 | 8/1981 | Nakano et al. |
| 4,362,809 | 12/1982 | Chen et al. |
| 4,370,405 | 1/1983 | O'Toole et al. ........................ 430/312 |

FOREIGN PATENT DOCUMENTS 57-18386  1/1982  Japan ....................................... 357/30
2005155   4/1979  United Kingdom ................. 357/30

OTHER PUBLICATIONS

"Planarizing Topographical Features With Spun-On Polymer Coatings" by L. K. White, from the Kodak Microelectronics Seminar, 10/21/82, pp. 72–82.
"Color Filter Array for IC Image Sensor" by Manabe et al., from the 1983 IEEE Proceedings dated May 25, 1983, pp. 451–455.

Primary Examiner—William L. Sikes
Assistant Examiner—Robert E. Wise
Attorney, Agent, or Firm—Dana M. Schmidt

[57] ABSTRACT

A device is disclosed comprising a non-planar semiconductor substrate and a planarizing layer thereon, the planarizing layer having a maximum thickness that is no greater than about 3μ and a planarization factor P≧1.0. In a preferred embodiment, the layer comprises a polymer formed from a liquid monomer coated onto the substrate and thereafter polymerized.

13 Claims, 3 Drawing Figures

PLANARIZING LAYER FOR SEMICONDUCTOR SUBSTRATES SUCH AS SOLID STATE IMAGERS

FIELD OF THE INVENTION

This invention relates to the field of semiconductor devices, including solid state imagers, and particularly to planarizing layers for such devices.

BACKGROUND OF THE INVENTION

Certain semiconductor devices require layered structures properly positioned on a semiconductor substrate for the intended use of the device. Examples include solid state imagers wherein the positioned layered structures are used to provide optical exposure to the device. For such imagers to be responsive to color, it is conventional to provide the imagers with color separation means. Highly preferred separation means are color filter arrays, particularly those that are integral with the underlying photosensor substrate. Particularly useful examples can be found in U.S. Pat. Nos. 4,190,446; 4,196,009; and 4,285,007, issued on Feb. 26, 1980; Apr. 1, 1980 and Aug. 18, 1981, respectively. Such integral color filter arrays are conveniently formed by coating the photosensor substrate with two or three dye-imbibable layers. The dyes can be selected to provide, e.g., blue, green and red filter elements in a predetermined pattern.

Designers of such integral color filter arrays often are faced with a dilemma. Unless the surface on which the individual filter elements are formed is planar, the arrays are subject to cracking and non-predictable performance. Cracking is unsatisfactory in a filter as it tends to allow white light through to expose the device. However, because the semiconductor circuit elements comprising the photosensor are by construction non-planar, with topography having a difference in height that is often in the range of 1.5μ, planarity is achieved only by interposing a planarizing layer between the filter elements and the photosensors. Because most coating materials are planarizing only when coated at substantial thicknesses, i.e., 4μ thickness or larger, the individual filter elements are raised a substantial distance from their underlying photosensor. The greater this distance is, the more likely it is that optical cross-talk will occur, wherein light from one filter element strays laterally to a pixel element not aligned with that element. Contamination due to cross-talk is then avoided, if at all, by shielding over that area susceptible to cross-talk. However, shielding can cause a loss in photosensor speed. Furthermore, certain kinds of imagers, such as charge-coupled frame transfer devices, have the potential to use 100% of the pixel area as photosensitive area.

On the other hand, planarizing compositions such as certain particular polymers coated out of a solution, have provided insufficient planarization when coated at thicknesses designed to avoid the optical cross-talk. This is believed to be due, in part, to hardening of the layer by evaporating the solvent for the particular polymer. As the solvent evaporates, some shrinkage in the polymer apparently occurs and the coating loses some of its planarization.

Thus, it has been very difficult, prior to this invention, to find a planarizing layer that is effective in providing a planar surface for subsequent layers without spacing those layers too far away, e.g., a distance exceeding 3μ.

Just as conventional intervening layers have been largely unable to effectively reduce their thickness, conventional methods for measuring the degree of planarization (D) have also become less adequate. Conventionally, $D = (1 - t_s/t)$ for t = the maximum height of the topography of the underlying substrate and $t_s$ = the remaining topographical height in the planarizing layer arising from the underlying topography, that is, the extent to which due to the underlying topography, the planarizing layer protrudes above the plane which its exterior surface otherwise occupies.

RELATED APPLICATION

Commonly owned U.S. application Ser. No. 501,225, filed on June 6, 1983, by Reithel et al, now U.S. Pat. No. 4,450,215, entitled "Color Filter Elements Comprising Hexaalkoxymethylmelamine Barrier Layers" describes a layer interposed between filter elements of one color and filter elements of another color, formed from a monomer. The preferred materials are said to be leveling in nature.

SUMMARY OF THE INVENTION

This invention is based upon the discovery of substantial improvements in planarizing layers, to provide maximum thicknesses that can be much less than 3μ, even over substantial topography. Such improvements in turn provide, when used to make a color filter array, a larger % of usable area of photosensor surface, uncontaminated by cross-talk, even when pixel sizes are reduced.

More specifically, there is provided, in one aspect of the invention, a device comprising an array of semiconductor circuit elements having a non-planar topography, the device including a planarizing layer covering the circuit elements. The planarizing layer is improved in that it comprises a composition that provides a planarizing factor P that is at least 1.0, wherein P is calculated from equation (1) below using a test coating of the composition on a test substrate comprising a planar surface from which project a plurality of raised, generally parallel lines of rectangular cross-section of a uniform height t of about 1.24μ and a uniform width no greater than about 8μ, the lines being spaced apart on the planar surface by about 16μ measured from the center of the lines, the coating being applied to the test substrate under conditions such that, if applied to a smooth, planar surface, it would have a thickness $t_{pe}$ substantially equal to 1.5μ. Equation (1) therefore is:

$$P = (1 - t_s/t) \cdot [t/(t_s + t_{pe} - t)]; \qquad (1)$$

wherein $t_s$, t and $t_{pe}$ are as shown in FIG. 1, and $t_s$ is the extent to which the planarizing layer protrudes, in microns, above the plane which the exterior surface of the planarizing layer occupies between protruded portions of the exterior surface, and, t and $t_{pe}$ are as defined above.

In another aspect of the invention, the planarizing layer of the aforesaid device is improved in that (a) it has a maximum thickness that is no greater than about 3.0μ, and (b) it comprises a polymer formed from a liquid monomer coated onto the substrate, and thereafter polymerized into a crosslinked polymer.

Thus, it is an advantageous feature of the invention that semiconductor substrates having uneven topography can be planarized for subsequent processing, using a planarizing layer of extreme thinness, i.e., one whose maximum thickness is <3.0μ.

Another advantageous feature of the invention is that an array of charge-handling photosensors can be fabricated with filters that are free from cracking and that have predictable performance characteristics, without introducing optical cross-talk to the array.

Other advantageous features will become apparent upon reference to the following description of preferred embodiments, when read in light of the attached drawings.

DESCRIPTION OF THE PREFERRED EMBODIMENTS

The invention is hereinafter described with respect to preferred embodiments, that is, planarizing layers formed by coating a semiconductor substrate with compositions that produce P factors as described of at least 1.0. Particularly the use of liquid monomers is described, to form planarizing layers for color-filter arrays. In addition, the invention is also applicable to planarizing layers formed by any other compositions and techniques. Thus, the invention is applicable to any semiconductor device wherein the semiconductor substrate is coated with a planarizing layer of the type claimed, regardless of the kinds of layers, if any, that are superimposed on the planarizing layer. For example, a solid state imager not requiring color filters can incorporate the invention. Still further, in another aspect of the invention, the liquid monomers comprising a preferred embodiment are useful as a temporary planarizing layer for any semiconductor device.

Figure 1:
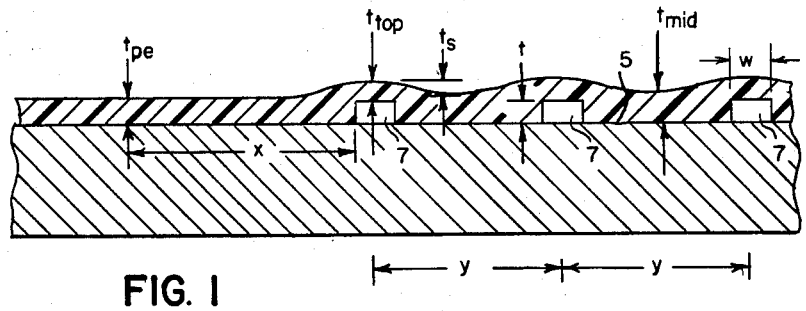
FIG. 1 is a partially schematic sectional view of a planarizing layer of the invention applied to a test substrate comprising a planar surface and upwardly projecting lines of rectangular cross-section, from which the terms of equation (1) are derived.

The invention is based upon the discovery that planarizing compositions having much improved planarization factors P can be provided, to overcome the dilemma faced by the prior art. The planarizing compositions can include liquid monomers coated as such on the uneven topography of a semiconductor substrate, which monomers are polymerizable into a coating that has such superior planarization factors. As used herein, "liquid monomer" means, liquid at the temperature at which coating takes place, preferably about 22° C. "Monomer" means any compound that does not contain recurring units that were produced by condensation or addition polymerization. "Planarizing layer" means a layer which, when applied to a substrate, undergoes a leveling function independent of pressures applied above and below the layer. It expressly excludes a flowable substance that flows because of pressure applied above the layer, because such substances, though flowable, are not themselves planarizing but require exterior pressures. Superior planarization values described herein are especially evident when the layer is coated at thicknesses appropriate to color filter array usage, that is, to give a maximum thickness that is no greater than about 3μ. The planarizing layers of the invention have a planarization factor P calculated by equation (1) above using the terms therein defined. The compositions of the present invention are those which provide a P factor of at least 1.0 when coated using the following test procedure (hereinafter, "test procedure"):

Referring to FIG. 1, the composition to be tested is coated onto a planar surface 5 having a plurality of raised rectangular lines 7 of a uniform height t of about 1.24μ and uniform width w no greater than about 8μ, spaced apart on center on the planar surface by distance y=about 16μ±0.1μ. The planar surface and rectangular lines 7 conveniently can be electrode lines deposited onto a semiconductor substrate. For purposes of the test substrate, "t=about 1.24μ" means, ±0.05μ.

The coating is applied so that $t_{pe}$ is substantially equal to 1.5μ, that is, within ±0.01μ. FIG. 1 is partially schematic in that $t_{pe}$ is actually determined by repeating the coating conditions but on a smooth, entirely planar substrate. Such a measurement of $t_{pe}$ corresponds to $t_{pe}$ as shown in FIG. 1 wherein $t_{pe}$ is measured away from lines 7 a distance x that is at least 10 cm. Although a $t_{pe}$ of 1.5μ may be somewhat less than would be needed if the maximum thickness equals 3.0μ, still a lesser value of $t_{pe}$ is selected for the test procedure because the trend is toward smaller and smaller pixel sizes.

In use with actual semiconductor devices, the maximum thickness usually occurs at the lowest points in the array of semiconductor circuit elements, for example, where wells occur.

With regard to equation (1) above, and FIG. 1 of the drawings, such equation is readily derived as follows.

The conventional measurement of planarization features the equation $D = (1 - t_s/t)$, the first term of equation (1). However, because such a value fails to reflect the effect produced at reduced thicknesses of the layer, the value D must be modified by the ratio of the height of the topography being covered, t, to the coverage of the planarizing layer over that topography, $t_{top}$. Thus, very thick layers, e.g., those with a maximum thickness of more than 3μ, are less effective planarizers than a thinner layer having the same $t_s$ value. Therefore, $$P' = (1 - t_s/t) \cdot (t/t_{top}). \qquad (2)$$

As is readily apparent, $t_{top} = t_s + t_{mid} - t$. Because $t_{mid}$ is difficult to measure (wherein $t_{mid}$ is measured at half the distance y, where y is preferably 16μ), P' is discarded in favor of P wherein P is obtained from P' by substituting $t_{pe}$, defined above, for $t_{mid}$.

Because equation (1) for the test procedure proposed above, has only one unknown if P must at least equal 1.0, namely $t_s$, then equation (1) can be readily solved for $t_s$. Such solution indicates that $t_s$ must be less than 0.5μ if P is ≧1.0. Therefore, the most preferred compositions for the planarizing layer are those which, when applied to the test procedure described above, produce a $t_s < 0.5\mu$.

If P is set equal to 1 in equation (1), and then the equation is solved for $t_s$, the result is that $t_s$ must be less than or equal to the height t of the topography of the substrate, less one-half the height $t_{pe}$ of the planarizing layer measured on a smooth, planar portion of the substrate.

Useful monomers are polymerized by a variety of techniques, once coated onto the substrate. For example, a coating of the monomer out of a solution can be heated to flow and thereafter polymerized in the presence of a catalyst. Included in this category are the monomers described in commonly owned U.S. application Ser. No. 501,225, filed by Reithel et al on June 6, 1983, entitled "Color Filter Elements Comprising Hexaalkoxymethylmelamine Barrier Layers." Examples include those monomers having the structural formula:

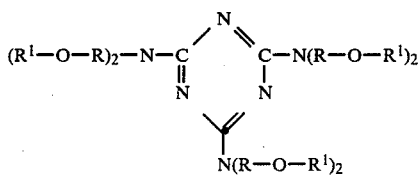

wherein R represents —CH$_2$— or

and R$^1$ is a straight or branched chain, lower alkyl radical having up to about 8 carbon atoms such as methyl, butyl, octyl, isopropyl and neopentyl. Preferably R is —CH$_2$— and R$^1$ is methyl, ethyl or butyl, for example, to give as the monomer, hexamethoxymethylmelamine. Examples of useful acid catalysts, described in the aforesaid Reithel et al application, include maleic acid, trimellitic acid, phthalic acid, alkylphosphoric acid and para-toluene sulfonic acid.

Most preferred, because they provide high planarization factors P, are the liquid photopolymerizable monomers that are polymerized in the presence of a photoinitiator, by exposure to activating radiation. Useful examples include alkyl acrylates containing from 1 to about 10 and most preferably 1 to about 5 carbon atoms in the alkyl portion, such as methyl acrylate, ethyl methacrylate and the like. Particularly preferred are diacrylate, triacrylate, and tetraacrylate monomers, their methacrylate counterparts, and mixtures of such monomers, e.g., pentaerythritol di- and triacrylates and methacrylates; esters of polyols including glycol diacrylates and dimethacrylates, such as tripropylene glycol diacrylate, tetraethylene glycol diacrylate, triethylene glycol dimethacrylate, diethylene glycol diacrylate and the like; alkanediol diacrylates such as hexanediol and cyclohexanediol diacrylates and the like; polyether diacrylates such as that obtainable from UCB, a division of Chimique Chaussee de Charleroi, Brussels, Belgium, under the trade name "Ebecryl 210"; and mixtures of the above. A device made using the di-, tri-, or tetraacrylates or methacrylates is distinguishable from one in which the planarizing layer is coated from prepolymerized polymers, in that the crosslinking that occurs to the liquid monomers renders them substantially insoluble in most solvents. In contrast, a coating of most preformed polymers that is merely dried will tend to remain soluble in the solvent from which it is coated.

Useful photoinitiators for such photopolymerizable monomers include the 3-ketocoumarins described in U.S. Pat. No. 4,147,552, issued on Apr. 3, 1979, and co-initiator compositions such as Michler's ketone and benzophenone, or a mixture of the 3-ketocoumarins noted above together with an amine activator of the type described in U.S. Pat. No. 4,289,844, issued Sept. 15, 1981, e.g., ethyl p-dimethylaminobenzoate. The amount of the photoinitiator or co-initiator composition does not appear to be critical. Useful amounts include amounts between about 0.0002 and about 0.5 mmole per gram of monomer content.

Such photoinitiators are preferably dissolved in a suitable solvent that is then added to the liquid monomer(s). Additionally, solvent is preferably added to the planarizing composition if the selected liquid monomer is fairly viscous. Preferably, the amount of solvent that is added is such as to produce a viscosity in the planarizing composition that is particularly suited for the coating procedure to be used, as is well known. The exact value of the viscosity depends on the coating procedure that is selected.

Particularly in the case of di-, tri- and tetraacrylate monomers, useful solvents include dichloroethane, cyclohexanone, and 2-ethoxyethanol.

The planarizing composition is applied to the substrate by any of a variety of techniques, such as spin-coating, spray-coating, curtain-coating, and the like.

Following the coating step the preferred planarizing composition is solidified by exposing it to activating radiation for a suitable length of time, the amount of which depends in part upon the monomer selected, the photoactivator selected and the atmospheric conditions during exposure. For example, exposure to light emanating from a 1000 w mercury or mercury-xenon light source for 1 to 5 minutes, is useful for many of the above-noted preferred compositions.

The afore-described preferred planarizing composition and procedure, although involving solvents similar to conventional planarizing compositions comprising preformed polymers, is believed to differ therefrom in an important respect: Most of the solvent appears to be evaporated prior to the hardening step, rather than as a result of the hardening step. Thus, little or no shrinkage occurs during hardening such as would interfere with the planarizing ability of the composition.

Yet another useful example of a planarizing layer of the invention having a P factor $\geq 1.0$ is a coating comprising a positive-working photoresist comprising a preformed cresol-formaldehyde polymer binder and a photosensitizer such as a benzophenone trisubstituted with a quinone diazide, for example, the resist obtainable from the Hunt Chemical Co. under the trade name "HPR-204". After the resist is coated out of a solvent, the coating is baked at a temperature and for a time sufficient to cause it to flow. For example, baking such a photoresist at 200° C. for from 1 to 5 minutes, and particularly 2 minutes, produces a planarization factor P that is greater than 1.0 when tested following the above-noted test procedure. Although the color of the photosensitizer is undesirable when using the planarizing layer in a solid state imager, this color is readily bleached by giving the device an overall exposure to activating radiation, before, during or after baking, to destroy the photosensitizer. That is, the exposure serves to render the planarizing layer at least 90% transmissive to light of wavelengths greater than 450 nm, the preferred condition of the planarizing layer.

Alternatively, to avoid the base solubility that follows from such bleaching, the cresol-formaldehyde polymeric binder of the aforesaid photoresist can be used without the photosensitizer, since it is the binder and not the photosensitizer that provides the essential thermal flow properties that give the previously unattained planarization factor P of this invention.

Still another useful example of a planarizing layer of the invention that provides a planarization factor $P \geq 1.0$ is a coating comprising photopolymerizable monomers that are solid at the coating temperature, and are therefore dissolved in a solvent for purposes of making the coating. (A suitable photoinitiator is also included.) After the solvent is evaporated, such monomers are heated sufficiently to produce thermal flow, before polymerization is effected, similar to the treatment given to the monomers described above with respect to related U.S. application Ser. No. 501,225, now U.S. Pat. No. 4,450,215. After the thermal flow, the instant monomers are hardened by exposure to activating radiation. The heating step is effective to correct whatever shrinkage that occurs in driving off the solvent from the coating, unlike prior planarizing techniques using polymers without a heating step. An example of a particularly useful "solid" monomer for such a planarizing layer is pentaerythritol tetraacrylate.

Various addenda are optionally incorporated into the planarizing layer. Preferably, if used to make a solid state imager, they are colorless, within the definition of "bleached" noted above. For example, preformed polymers dissolved in a suitable solvent or the liquid monomer, or oligomers, can be included in small amounts, so long as they do not interfere substantially with the planarizing ability of the planarizing layer.

Other addenda include antihalation dyes, to prevent UV light from scattering due to a scattering surface of the imager, usually a layer of polysilicon or metal, during the photolithography steps used to form the color filter elements. Useful dyes are those that are soluble in the planarizing composition and which absorb the wavelengths of light used for the photolithography while remaining colorless within the definition of "bleached" noted above. Or alternatively, after the planarizing layer has been hardened by exposure, the antihalation dye can be added by, for example, heat transferring it into the planarizing layer.

Still other useful addenda include hardeners such as acrylated urethanes, and adhesion promoters such as aliphatic ethylenically-unsaturated carboxylic acid, such as those described in U.S. Pat. No. 4,171,979, issued Oct. 23, 1979.

Figure 2:
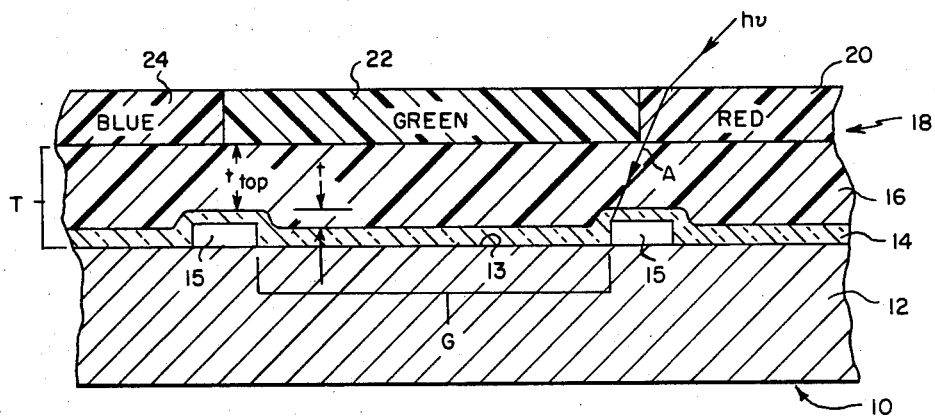
FIG. 2 is a schematic sectional view of an array of charge-handling semiconductor photosensors, a planarizing layer of the invention, and a micro-registered array of color filter elements.

The planarizing layers of the invention are particularly useful in making solid state imagers 10, FIG. 2. For purposes of illustration, FIG. 2 is a schematic presentation of the cross-section taken through a charge-coupled frame transfer device comprising a semiconductor substrate 12 comprising charge-handling photosensors having a surface 13 that is generally planar along this section line, from which project various raised features 15 that are comparable to lines 7 of FIG. 1. As shown in FIG. 2, such raised features most preferably are opaque and underlie the junction between the colored filters, to shield against cross-talk. However, because opaque features 15 reduce the area of each pixel of substrate 12, of which the green area is identified as "G", the width of features 15 is preferably minimized. Examples of useful photosensors include charge-coupled imagers, charge-transfer devices, charge-transfer imagers and the like, charge-injection devices, bucket-brigade devices, diode arrays and combinations of these. Useful solid state imaging devices are described, for example, in U.S. Pat. Nos. 3,801,884; 3,971,065; 3,982,274; 4,054,906; 4,054,915; and 4,360,821.

A thin transparent protective layer 14, usually of silicon dioxide, is applied over surface 13 and features 15.

The planarizing layer 16 of this invention is contiguous with both the protective layer 14, and layer 18 that provides the array of color filters. The color filters can comprise separate arrays 20, 22 and 24 of red, green and blue filters, respectively, appropriately micro-registered with respect to the photosensors underneath. As used herein, the term "micro-registration" means that the color array sets of the color filter elements and the photosensor array are precisely aligned on a micron scale. In other words, the position of a color array set is displaced less than about 1 micron away from its intended overlying position with respect to the photosensor array.

It will be readily apparent from the example shown in FIG. 2, that if $t_{top}$ exceeds the value therein shown, instead of arrow A being shielded by opaque feature 15, it will instead register in area "G", the green sensor area, but as part of the red image, thus producing cross-talk. It is for this reason that the maximum thickness of the layer 16 is to be minimized. The actual values of this maximum thickness will vary based upon a nunber of factors, including the size of the pixel. The smaller the value of $t_{top}$, the less will be the loss of useful area, up to the point at which $t_{top}$ is so small that there is insufficient thickness to cover the substrate. On the other hand, if the pixel size is increased, the % loss of area becomes less for a given $t_{top}$. Because the trend is toward smaller, rather than larger, pixel sizes, the value of $t_{top}$ must be minimized.

A square pixel 15$\mu$ on a side, located at the focal plane and on the optical axis of an f 1.4 lens, illustrates the significance of smaller pixel sizes. If the color filter elements and the planarizing layer are assumed to have an index of refraction of 1.5, it can be readily shown that if T, FIG. 2, reaches about 3.4$\mu$, the amount of pixel area uncontaminated by optical cross-talk is reduced to 80%. If the protective layer 14, in FIG. 2, is of similar index of refraction to that of the planarization layer, its thickness must be included in the total thickness T, thereby reducing the acceptable thickness of the planarizing material itself. If the pixel size of this example is reduced to 10$\mu$ on a side, T cannot exceed about 2.3$\mu$ to maintain the uncontaminated area at about 80%. It will be appreciated that for pixels off the optical axis, i.e., those away from the center of the sensor, the contamination can be worse. The same is true if a lower f-number lens is used.

It will be appreciated that the blue, green and red filters of FIG. 2 are schematically depicted. That is, in many applications it is not possible to have all three filters disposed in one common plane as shown. Rather, individual filter elements may comprise one or more layers that overlie to some extent layers used to form other filter elements. Even in such a case the planarizing layer of the invention provides a marked improvement over those of the prior art, because no matter how many layers are required for each of the individual filter elements, if the underlying support for the filter elements is not generally planar (because of the semiconductor circuit element topography), cracking or nonpredictable performance can be a problem.

Any method for forming the color filters 20, 22, 24 in situ on top of the planarizing layer 16, FIG. 2, is useful. A number of such methods are disclosed in, e.g., U.S. Pat. Nos. 4,196,009, issued Apr. 1, 1980; 4,315,978, issued Feb. 16, 1982, and 4,355,087, issued Oct. 19, 1982. A preferred method is as follows:

A photosensitive, dyeable composition is applied to the surface of the planarizing layer 16 by a suitable coating method. The dyeable composition can be coated, for example, by spray coating, air knife coating and the like. The preferred method is to spin-coat a solution of the photosensitive dyeable composition on the imaging surface. It is generally desirable to maintain the thickness of the coated photosensitive dyeable composition less than about 4μ.

Following coating and drying of a layer of the photosensitive dyeable composition, the layer is exposed through a patterned mask which represents the pattern of the desired color array set. The exposure is made with light to which the photosensitive composition is sensitive, generally UV radiation. (Areas which have been exposed are made insoluble by the exposure.) After the photosensitive layer is exposed, it is rinsed in a solvent for the composition to remove the unexposed dyeable material. If a hydrophilic colloid such as dichromated gelatin is used as the photosensitive dyeable composition, water is preferably used in this rinsing step. The result is an array set which corresponds to the color mask.

The set is then dyed to produce a first color array set. If a hydrophilic colloid is the dyeable material, and a reactive dye is used, this dyeing step is conveniently carried out by simply immersing the layer in a water solution of the reactive dye. In the preferred embodiments, where dichromated gelatin is used with reactive dyes, the pH of the dye solution is selected so as to promote the rapid dyeing of the dichromated gelatin. Dyes with reactive groups containing aromatic ring structures are most reactive with dichromated gelatin in the pH range of about 5.0. For a given dye and a given dyeable composition, the optimum pH can be determined by simple experiment. The concentration of dye in the dyeing solution varies over a wide range. Generally, the dye concentration is above about 2 g/100 mL up to the solubility limit of the dye, although lower concentrations are useful. Usually, dyeing is complete in about 200 seconds to about 8 minutes. Temperatures above room temperature are sometimes useful in this dyeing step.

The thus formed first color array set is then dried.

Prior to the formation of the second and third color array set, it is preferable, particularly in those instances in which the dyeing step for the next array may "bleed" into the array(s) previously formed, to first coat the previously formed filter array with a protective barrier. Particularly preferred examples of such barriers are described in the above-noted U.S. Pat. No. 4,315,978.

The above steps are repeated to form the additional color array sets as needed, usually to provide the red, green and blue filter sets 20, 22 and 24 as noted.

To wire bond the solid state imager to lead lines, portions of the planarizing layer not covered by a color filter element can be removed, such as by patterning the layer using the photosensitivity of the aforementioned photosensitive monomers, or by other means known in the art.

EXAMPLES

The following examples further illustrate the scope of the invention.

Example 1—Photopolymerizable Monomer Used in Planarizing Layer

A 762 mm diameter wafer containing arrays of charge-handling semiconductor sensors each having a region of parallel raised aluminum lines overcoated with silox and raised above the surface by a height $t=1.24\mu$ as schematically shown in FIG. 1, a width w of about $3.8\mu$, and spaced apart a distance "y"$=16\mu$, was spin-coated with the following liquid composition (after filtering at $5\mu$):

| | |
|---|---|
| 3-benzoyl-5,7-di-n-propoxycoumarin | (0.5 g) |
| ethyl p-dimethyl-aminobenzoate | (1.0 g) |
| dichloroethane solvent | (2.0 cc) |
| tripropylene glycol diacrylate obtained from Sartomer Co. under the trade name SR-306 | (15 g) |

Figure 3:
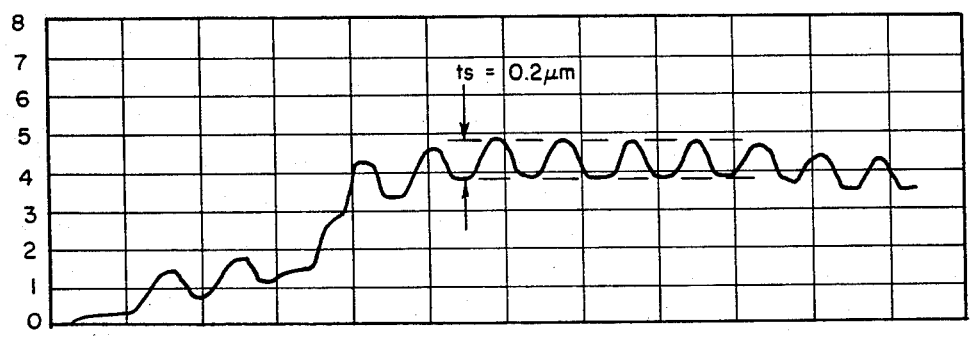
FIG. 3 is a tracing by a profilometer of one of the planarizing compositions of the invention when applied to a substrate of uneven topography in accord with the invention.

The composition was spin-coated at 1670 RPM for 2 minutes, so that the value of $t_{pe}$, measured on a planar glass substrate was $1.50\mu$. Most of the solvent had evaporated at this point. The coating was then hardened by exposure under vacuum to 1000 w mercury-xenon light source, specifically a Tamarack Model PRX-500/1000 DUV, for 3 minutes. Thereafter, the surface of the coating in the area of the read-out portion of the device was traced with a Dektak Surface Profilometer using a $2.5\mu$ radius stylus, to produce the graph shown in FIG. 3. The value of $t_s$ was measured as the distance between the troughs and peaks over that portion of the underlying structure having $t=1.24\mu$, as shown. From this trace, $t_s$ was measured to be about $0.2\mu$. Using equation No. (1) above, this produces a planarization factor $P=2.3$.

Examples 2-4—Other Photosensitive Monomers

Example 2

The procedure of Example 1 was repeated, except that the monomer material was replaced with diethylene glycol diacrylate obtained from Sartomer Co. under the trade name SR-230, and spin-coating occurred at 1400 RPM. $t_s$ was measured as in Example 1 and found to be $0.21\mu$, giving $P=2.2$.

Example 3

The procedure of Example 1 was repeated, except that:
  (a) The planarizing composition comprised 2.5 g of the coumarin of Example 1, 5 g of the benzoate of Example 1, and 90 g of dichloroethane, 22.5 g of this solution being then admixed with 7.5 g of trimethylolpropane triacrylate.
  (b) t was between 1.1 and $1.3\mu$,
  (c) Spin-coating was at 2800 RPM, and
  (d) Exposure was to a mercury lamp only, for 30 sec.

The result was a measured $t_s=0.19\mu$, giving a planarization factor P (assuming $t=1.1$) of 1.54. If t were actually $1.24\mu$, or this value of $t_s$, then P would be slightly larger.

Example 4

The procedure of Example 1 was repeated, except that:

(a) The planarizing composition comprised 100 g of a mixture of pentaerythritol di-, tri- and tetraacrylate in weight % amounts of 6–10%, 45% and 45%, respectively, obtained from Ware Chemical under the trade name "Chemlink 41D Topcoat", admixed with 100 g of a mixture of urethane diacrylate and urethane triacrylate obtained from Fuller-O'Brien under the trade name "UV-Curable Topcoat 874-C-2002A", 5 g of the coumarin of Example 1, 10 g of the benzoate of Example 1, and 300 g of 2-ethoxyethanol (solvent).

(b) The width w of lines 7 was 8$\mu$, (c) t was between 1.1 and 1.3, (d) Spin-coating was at 1000 RPM, (e) $t_{pe}$ was found to be 1.4$\mu$ instead of 1.5$\mu$, and (f) exposure was for 5 minutes.

When $t_s$ was measured, it was found to be 0.34$\mu$, which for t=1.1$\mu$ and $t_{pe}$=1.4$\mu$, gave a P factor of 1.2. This value will be reduced, but still $\geq$1.0, for a coating wherein $t_{pe}$=1.5$\mu$ and t=1.24$\mu$.

Example 5—A Monomer That is Non-photosensitive

The procedure of Example 1 was repeated except that t was between 1.1$\mu$ and 1.3$\mu$ and the planarizing composition comprised:

| | |
|---|---|
| hexamethoxymethylmelamine monomer obtained from American Cyanamid under the trade name Cymel 300 | (50 g) |
| p-toluenesulfonic acid catalyst | (2 g) |
| isopropanol solvent | (156 g) |

This was filtered through a 1$\mu$ filter and spin-coated at 1000 RPM for 2 min. Thereafter it was heated at 130° C. for 10 min to first cause the monomer to flow and then to polymerize into a layer of crosslinked polymer. $t_s$ was measured as in Example 1, and found to be about 0.4$\mu$. Assuming that t=1.2$\mu$, this produced a planarizing factor P of 1.1.

Example 6—A Polymer Heated to Produce Flow

A semiconductor substrate having raised topography with t=1.24 and a lateral spacing of 16$\mu$ on center was coated at 3000 RPM with Hunt HPR-204 resist, which is a cresol-formaldehyde novolak resin to which has been added benzophenone trisubstituted with a quinone-diazide, at 28% solids, to give a $t_{pe}$ of 1.5$\mu$ after baking at 105° C. for 30 min. This was exposed to 10 sec of UV radiation, and then heated for 2 minutes at 200° C. as described in "Planarizing Topographical Features with Spun-On Polymer Coatings", White, Microelectronics Seminar, Oct. 21, 1982, pp. 72–82. Subsequently, $t_s$ was measured and found to be 0.24$\mu$ to produce a P factor, determined by equation (1) above, that was 2.0.

By way of comparison, when the HPR-204 resist was simply spun-on without a subsequent bake treatment, as Comparative Example 1, $t_s$ was found to be 0.58$\mu$. The P factor, measured over the same substrate as the instant example, was found to be only 0.78.

Comparative Example 2

The procedure of Example 1 was repeated, except that t was between 1.1 and 1.3$\mu$, and the planarizing composition comprised the following materials:

| | |
|---|---|
| cyclized polyisoprene | (12.5 g) |
| 2,6-bis[(4-azidophenyl)-methylene]-4-methylcyclohexanone photosensitizer | (0.375 g) |
| p-xylene and o-xylene solvent | (90 g) |
| a phenylenediamine stabilizer | (.0275 g) |

This was spin coated at 1500 RPM to give a $t_{pe}$ of 1.5$\mu$ after the bake treatments hereinafter described. This was given a prebake treatment at 80° C. for 30 min., exposed to UV for 30 sec and heated at 130° C. for 30 min. $t_s$ was measured as in Example 1, and found to be 0.59$\mu$. Assuming that t=1.3$\mu$, this gave a P factor of about 0.9. (Use of a t=1.24$\mu$ will cause a further reduction in P.) This material, as well as Comparative Example 1 noted above, was less satisfactory as a planarizing material than the planarizing compositions noted in Examples 1–6. That is, the unevenness of the surfaces was such as to encourage the problems noted in the prior art.

Example 7—Solid Planarizing Composition Heated to Flow

The procedure of Example 1 was repeated, except that the planarizing layer was formed by spin-coating pentaerythritol tetraacrylate, a waxy solid at 22° C., dissolved in 32.7 g of dichloroethane, at 4400 RPM, together with the co-initiators of Example 1. After spin-coating had driven off the solvent, the layer was found to be very uneven. The planarizing layer was then heated at 80° C. for 0.5 min to cause it to flow, after which it was polymerized by exposing it as in Example 1.

When $t_s$ was measured, it was found to be 0.18$\mu$, giving a planarization factor P of 2.4.

The invention has been described in detail with particular reference to preferred embodiments thereof, but it will be understood that variations and modifications can be effected within the spirit and scope of the invention.

What is claimed is:

1. In a device comprising a semiconductor substrate including an array of circuit elements having a non-planar topography, the device including a planarizing layer permanently covering said circuit elements;

the improvement wherein said planarizing layer comprises a composition prepared from a monomer that produces, on a test substrate comprising a planar surface from which projects a topography of measurable height t, undulations in the top surface of said planarizing layer that have a height $t_s$ less than or equal to said height t of the topography of said substrate, less one-half the height $t_{pe}$ of the planarizing layer measured on a smooth, planar portion of said substrate.

2. In a device comprising a substrate of an array of charge-handling semiconductor photosensors, a plurality of radiation-intercepting filter elements sufficient to provide color image detection to said photosensors, said array being micro-registered with the sensing areas of said photosensors, and disposed between said filter elements and said photosensors, a planarizing layer having at least 90% transmittance to light of wavelengths greater than 450 nm;

the improvement wherein said planarizing layer comprises a composition prepared from a monomer that produces, on a test substrate comprising a planar surface from which projects a topography of measurable height t, undulations in the top surface of said planarizing layer that have a height $t_s$ less than or equal to said height t of the topography of said substrate, less one-half the height $t_{pe}$ of the planarizing layer measured on a smooth, planar portion of said substrate.

3. A device as defined in claim 1 or 2, wherein said planarizing layer is obtained from a liquid monomer coated onto said substrate, and thereafter polymerized into a crosslinked polymer.

4. A device as defined in claim 3, wherein said planarizing layer comprises a crosslinked polymer formed from a photopolymerizable liquid monomer coated onto said substrate in the presence of a photoinitiator, and thereafter polymerized into said polymer by exposure to activating radiation.

5. A device as defined in claim 1 or 2, wherein said monomer is a di-, tri-, or tetraacrylate.

6. In a device comprising a semiconductor substrate including an array of circuit elements having a non-planar topography, the device including a planarizing layer permanently covering said circuit elements;

the improvement wherein said planarizing layer
(a) has a maximum thickness that is no greater than about 3.0μ, and
(b) comprises a composition that provides a planarizing factor P that is at least 1.0,
wherein P is calculated from the equation $$P=(1-t_s/t)\cdot[t/(t_s+t_{pe}-t)],$$

using a test coating of said composition on a test substrate comprising a planar surface from which project a plurality of raised, generally parallel lines of rectangular cross-section of a uniform height t of about 1.24μ and a uniform width w no greater than about 8μ, said lines being spaced apart on said surface by about 16μ measured from the center of said lines, said coating being applied to said test substrate under conditions such that, if applied to a smooth, planar surface, it would have a thickness $t_{pe}$ substantially equal to 1.5μ, wherein
$t_s$ is the extent to which said planarizing layer protrudes, in microns, above the plane which the exterior surface of said planarizing layer occupies between protruded portions of said exterior surface, and, t and $t_{pe}$ are as defined above.

7. In a device comprising a substrate of an array of charge-handling semiconductor photosensors, a plurality of radiation-intercepting filter elements sufficient to provide color image detection to said photosensors, said array being micro-registered with the sensing areas of said photosensors, and disposed between said filter elements and said photosensors, a planarizing layer having at least 90% transmittance to light of wavelengths greater than 450 nm;

the improvement wherein said planarizing layer
(a) has a maximum thickness that is no greater than about 3.0μ, and
(b) comprises a composition that provides a planarizing factor P that is at least 1.0,
wherein P is calculated from the equation $$P=(1-t_s/t)\cdot[t/(t_s+t_{pe}-t)]$$

using a test coating of said composition on a test substrate comprising a planar surface from which project a plurality of raised, generally parallel lines of rectangular cross-section of a uniform height t of about 1.24μ and a uniform width w no greater than about 8μ, said lines being spaced apart on said surface by about 16μ measured from the center of said lines, said coating being applied to said test substrate under conditions such that, if applied to a smooth, planar surface, it would have a thickness $t_{pe}$ substantially equal to 1.5μ, wherein
$t_s$ is the extent to which said planarizing layer protrudes, in microns, above the plane which the exterior surface of said planarizing layer occupies between protruded portions of said exterior surface, and, t and $t_{pe}$ are as defined above.

8. A device as defined in claim 6 or 7, wherein said planarizing layer is obtained from a liquid monomer coated onto said substrate, and thereafter polymerized into a crosslinked polymer.

9. A device as defined in claim 8, wherein said planarizing layer comprises a crosslinked polymer formed from a photopolymerizable liquid monomer coated onto said substrate in the presence of a photoinitiator, and thereafter polymerized into said polymer by exposure to activating radiation.

10. A device as defined in claim 9, wherein said monomer is a di-, tri-, or tetraacrylate.

11. In a device comprising a substrate of an array of charge-handling semiconductor photosensors, a plurality of radiation-intercepting filter elements sufficient to provide color image detection to said photosensors, said array being microregistered with the sensing areas of said photosensors, and disposed between said filter elements and said photosensors, a planarizing layer having at least 90% transmittance to light of wavelengths greater than 450 nm;

the improvement wherein said planarizing layer
(a) has a maximum thickness that is no greater than about 3.0μ, and
(b) when coated onto a test substrate comprising a planar surface from which project a plurality of raised, generally parallel lines of rectangular cross-section of a uniform height of about 1.24μ, a uniform width no greater than about 8μ, and a spacing on center of about 16μ, so as to produce a thickness of about 1.5μ when measured by coating said planarizing composition under identical conditions onto a smooth planar surface, protrudes, due to the underlying topography, a distance less than 0.5μ above the plane which the exterior surface of the planarizing layer occupies between said protruded portions of said exterior surface.

12. In a device comprising a substrate of an array of charge-handling semiconductor photosensors, a plurality of radiation-intercepting filter elements sufficient to provide color image detection to said photosensors, said array being microregistered with the sensing areas of said photosensors, and disposed between said filter elements and said photosensors, a planarizing layer having at least 90% transmittance to light of wavelengths greater than 450 nm;

the improvement wherein said planarizing layer
(a) has a maximum thickness that is no greater than about 3.0μ, and
(b) comprises a polymer formed from a liquid monomer coated onto said semiconductor substrate and thereafter polymerized into a crosslinked polymer, said planarizing layer, when coated onto a test substrate comprising a planar surface from which project a plurality of raised, generally parallel lines of rectangular cross-section of a uniform height of about 1.24μ, a uniform width no greater than about 8μ, and a spacing on center of about 16μ, so as to produce a thickness of about 1.5μ when measured by coating said planarizing composition under identical conditions onto a smooth planar surface, protrudes, due to the underlying topography, a distance less than 0.5μ above the plane which the exterior surface of the planarizing layer occupies between said protruded portions of said exterior surface.

13. A device as defined in claim 12, wherein said monomer is a di-, tri-, or tetraacrylate.

* * * * *